United States Patent [19]

Biran

[11] 4,242,693

[45] Dec. 30, 1980

[54] COMPENSATION OF $V_{BE}$ NON-LINEARITIES OVER TEMPERATURE BY USING HIGH BASE SHEET RESISTIVITY DEVICES

[75] Inventor: Joseph Biran, Sunnyvale, Calif.

[73] Assignee: Fairchild Camera & Instrument Corporation, Mountain View, Calif.

[21] Appl. No.: 972,742

[22] Filed: Dec. 26, 1978

[51] Int. Cl.³ .............................................. H01L 23/56
[52] U.S. Cl. ...................................... 357/28; 357/34; 357/58
[58] Field of Search ............................... 357/28, 34, 58

[56] References Cited
U.S. PATENT DOCUMENTS 3,831,040  8/1974  Nanba et al. ............................ 357/28

Primary Examiner—Edward J. Wojciechowicz
Attorney, Agent, or Firm—Paul J. Winters; Ronald J. Meetin; Michael J. Pollock

[57] ABSTRACT

In a transistor circuit a linear relationship between $V_{BE}$ and temperature is obtained by using high base sheet resistivity devices, such as super beta NPN transistors, or lateral PNP transistors. Alternatively, high base sheet resistivity devices are fabricated having a non-linear $V_{BE}$ vs. temperature relationship that is matched to the non-linear $V_{BE}$ vs. temperature relationship of NPN devices and/or the non-linear resistivity of diffused resistors over temperature, such that the sum or difference of the non-linear terms will exactly cancel, providing a linear voltage vs. temperature relationship for the circuit as a whole.

14 Claims, 6 Drawing Figures

COMPENSATION OF $V_{BE}$ NON-LINEARITIES OVER TEMPERATURE BY USING HIGH BASE SHEET RESISTIVITY DEVICES

BACKGROUND OF THE INVENTION

1. Field of the Invention

This invention relates to a new and improved circuit configuration for use in integrated circuit design.

2. Prior Art

Previous attempts to construct an ideal Bandgap reference circuit have centered on obtaining a voltage difference between the base-emitter voltages of two transistors operating at different current densities, in an attempt to compensate for the effects of $V_{BE}$ vs. temperature. Such an arrangement is shown in Brokaw, IEEE, JSSC 1974 Digest Page 188 and Widler, IEEE JSSC Vol. SC-6 No. 1, Feb. 1971. However, such a configuration only reduced the variation of output voltage over temperature by eliminating the linear variation of $V_{BE}$ with temperature, rather than eliminating the non-linearity of $V_{BE}$ with temperature. ($V_{BE}$ is the base emitter voltage of the transistor with the transistor turned on).

SUMMARY OF THE INVENTION

This invention overcomes the disadvantages of the prior art by recognizing that the $V_{BE}$ vs. temperature characteristics of devices with high base sheet resistivity are dependent upon the process used to fabricate such devices and that this process can be adjusted to eliminate or to match the non-linearity of ordinary transistors and/or diffused resistors such that the sum or difference of the voltage vs. temperature characteristics of the ordinary transistors and/or diffused resistors and the high base sheet resistivity transistors of this invention will eliminate the non-linearity of the circuit as a whole.

DETAILED DESCRIPTION

Typical NPN transistors used in the semiconductor industry have a $V_{BE}$ vs. temperature relationship as follows:

$$V_{BE} = (kT/q)\ln(I_C/I_{ES} + 1) \tag{1}$$

This relationship consists of linear and non-linear terms. The linear term is approximately:

$$\partial V_{BE}/\partial T = -2.2 \text{ mV/°C.} \tag{2}$$

and the non-linear term represents a curve which opens downward (see FIG. 1).
where
$V_{BE}$ = base-emitter voltage
k = Boltzman's constant
T = temperature,
q = the charge of an electron,
$I_C$ = collector current, and
$I_{ES}$ = reverse saturation current.

From KUIJK, IEEE JSSC Vol. SC-8, No. 3, June 1973:

$$I_{ES} = AT\, n_i^2 \bar{\mu}_n \tag{3}$$

$$n_i^2 = BT^3 \exp(-qV_{GO}/kT) \tag{4}$$

and $$\bar{\mu}_n = CT^{-n} \tag{5}$$

where
$\bar{\mu}_n$ = mobility of electrons
$n_i$ = intrinsic carrier concentration
n = an empirical parameter depending on doping level
$V_{GO}$ = gap voltage of silicon at 0° K., 1.205 V
A, B, C = temperature independent parameters Combining (3), (4) and (5), gives the following equation:

$$I_{ES} \approx DT^\eta \exp(-qV_{GO}/kT) \tag{6}$$

where $$D = ABC$$

and $$\eta = 4 - n$$

from (1) and (6):

$$I_C \approx DT^\eta \exp[(q/kT)(V_{BE} - V_{GO})] \tag{7}$$

and $$V_{BE} \approx V_{GO} + (kT/q)\ln(I_C/DT^\eta) \tag{8}$$

Differentiating with respect to temperature, holding $I_C$ constant, gives $$\left.\frac{\partial V_{BE}}{\partial T}\right|_{I_C = \text{constant}} = [(V_{BE} - V_{GO})/T] - \eta k/q \tag{9}$$

Substituting $V_{BE}$ from (8)

$$\left.\frac{\partial V_{BE}}{\partial T}\right|_{I_C = \text{constant}} = (k/q)\ln(I_C/DT^\eta) - \eta k/q \tag{10}$$

In (10), $\eta k/q$ represents the linear variation of $V_{BE}$ with temperature; $(k/q)\ln(I_C/DT^\eta)$ represents the non-linear variation of $V_{BE}$ with temperature. Differentiating $V_{BE}$ a second time, with respect to temperature $$\left.\frac{\partial^2 V_{BE}}{\partial T^2}\right|_{I_C = \text{constant}} = -\eta k/qT \quad (11)$$

From (11) we see that to eliminate the non-linearity of $V_{BE}$ over temperature, $\eta$ must equal zero. In actual practice, $\eta \approx 2$. Since $\eta = 4-n$, and $\overline{\eta}_n = CT^{-n}$, in order to decrease $\eta$ to 0, n must increase to 4, which in turn requires $\overline{\eta}_n$, and thus the doping concentration in the base, to decrease. Such a decrease in base doping concentration results in a device with an increased base sheet resistivity. If $\eta = 0$, equation (8) becomes simply $V_{BE} = V_{GO} + \gamma T$, where $\gamma = (k/q) \ln(I_C/D)$, and is temperature independent. (12)

Among the devices which have an increased base sheet resistivity are "super Beta" NPN transistors, in which the base width is extremely small, and lateral PNP transistors in which the P type collector and emitter regions are diffused into the N type epitaxial layer, which serves as the base.

Figure 2:
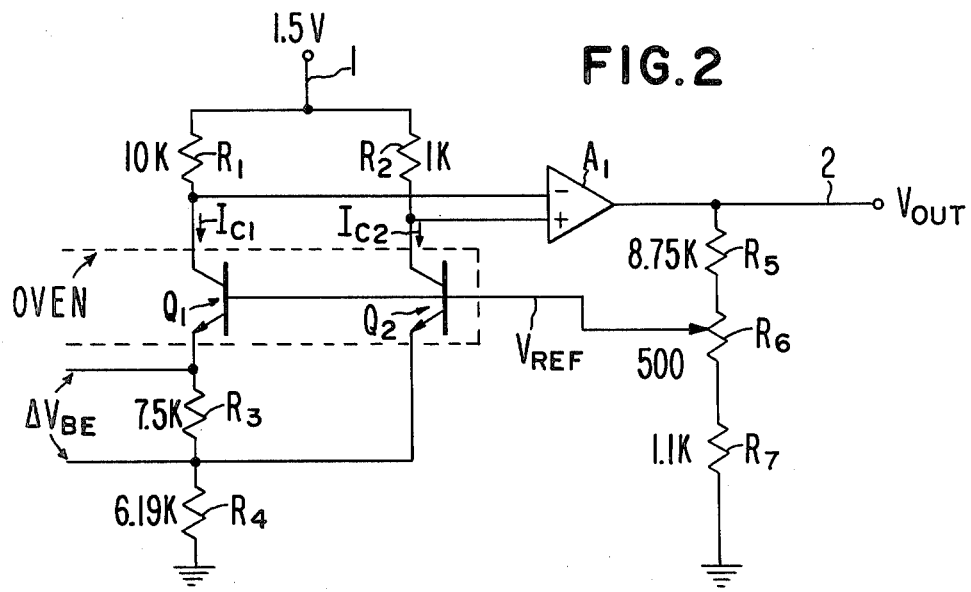
FIG. 2 shows a circuit containing super Beta transistors used in accordance with the invention.

The bandgap reference circuit shown in FIG. 2 was constructed in accordance with this invention using "super Beta" NPN transistors ($Q_1$ and $Q_2$). Bandgap reference circuits contain two identical transistors, ($Q_1$ and $Q_2$ in FIG. 2), which are situated in an oven of variable temperature. These transistors are operated at different collector currents, due to different values of current ratio setting resistors ($R_1 = 10K$ for $Q_1$, and $R_2 = 1K$ for $Q_2$). Due to these fixed resistor values, the ratio of the collector currents in $Q_1$ and $Q_2$ is constant. The difference in base-emitter voltages ($\Delta V_{BE}$) appears across $R_3$. This voltage is amplified by operational amplifier $A_1$ and represented as $V_{out}$ appearing at lead 2. Since the base currents are negligable, $V_{out}$ is divided by the voltage divider comprised of $R_5 = 8.25 K$, $R_6 = 500$, $R_7 = 1.1K$, (all in ohms) and applied to the bases of $Q_1$ and $Q_2$. If we call this base voltage $V_{ref}$, $$V_{ref} = V_{BE2} + V_4 \quad (13)$$

where $V_4$ is the voltage across $R_4$.

$$V_4 = (I_{C1} + I_{C2}) R_4 \quad (14)$$

If $m = I_{C2}I_{C1}$ the ratio of collector currents, then $$V_4 = (m+1) \Delta V_{BE} R_4/R_3. \quad (15)$$

From (8) $\Delta V_{BE} = (kT/q) \ln(I_{C2}/I_{C1}) \quad (16)$ and $$V_{out} \approx (1 + R_5/R_7) V_{ref} \quad (17)$$

so $$V_{out} \approx (1 + R_5/R_7)[V_{BE2} + (m+1)(R_4/R_3)(kT/q)\ln(m)] \quad (18)$$

since $R_3$, $R_4$, $R_5$, $R_7$ and m are temperature independent, $$\frac{\partial V_{out}}{\partial T} = \quad (19)$$

$$(1 + R_5/R_7)\left[\frac{\partial V_{BE2}}{\partial T} + (m+1)(R_4/R_3)(k/q)\ln(m)\right]$$

From this we can conclude that if $V_{out}$ varies linearly with temperature, $V_{BE2}$ must vary linearly with temperature. $\Delta V_{BE}$ must also vary linearly with temperature, since $V_{out}$ is simply $\Delta V_{BE}$ amplified by $A_1$. Since $\Delta V_{BE} = (V_{BE1} - V_{BE2})$, $V_{BE1}$ must vary linearly with temperature as well.

Figure 3:
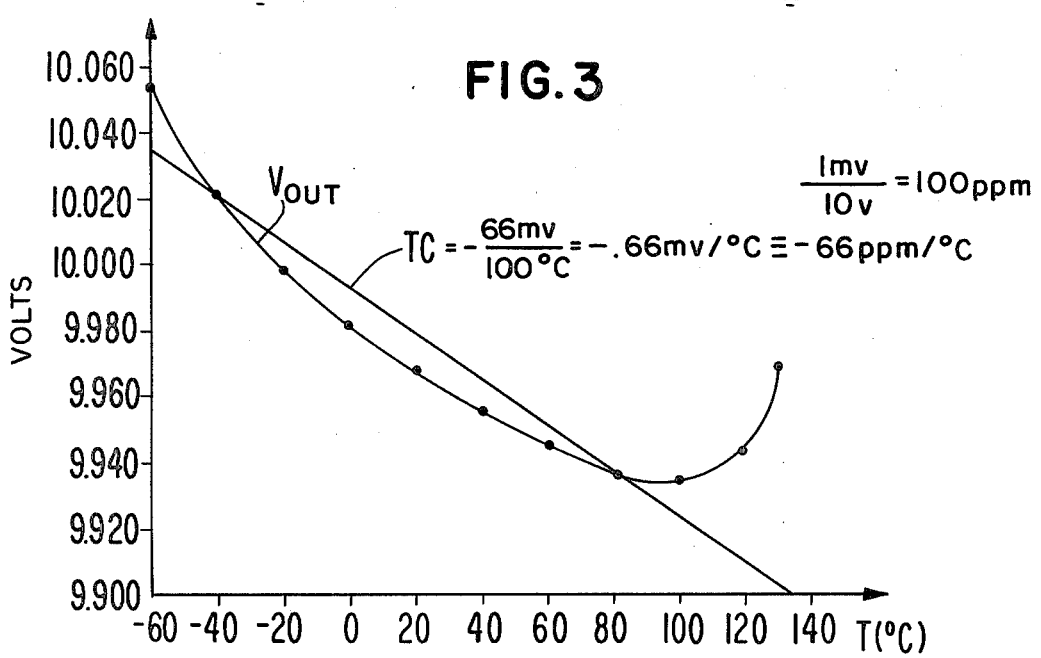
FIG. 3 shows the $V_{BE}$ vs. temperature relationship for the super Beta transistors used in the circuit of FIG. 2, and the approximate thermal coefficient (TC) of $V_{BE}$ over a typical operating range of $-40°$ C. to $80°$ C.

The super Beta NPN transistors used have a base doping surface concentration on the order of $10^{16}$ atoms/cm$^3$, as contrasted with typical NPN transistor base doping surface concentration of approximately $10^{18}$ atoms/cm$^3$. Due to the lower base doping in the super Beta transistors, the base sheet resistivity is between 5,000 and 10,000 ohms/square, as contrasted with typical NPN transistor base sheet resistivity on the order of 130 ohms/square. The resultant $V_{BE}$ vs. temperature relationship for this circuit is shown in FIG. 3. An approximate thermal coefficient (TC in FIG. 3) is also shown for the temperature range of $-40°$ to $80°$ C.

Figure 4:
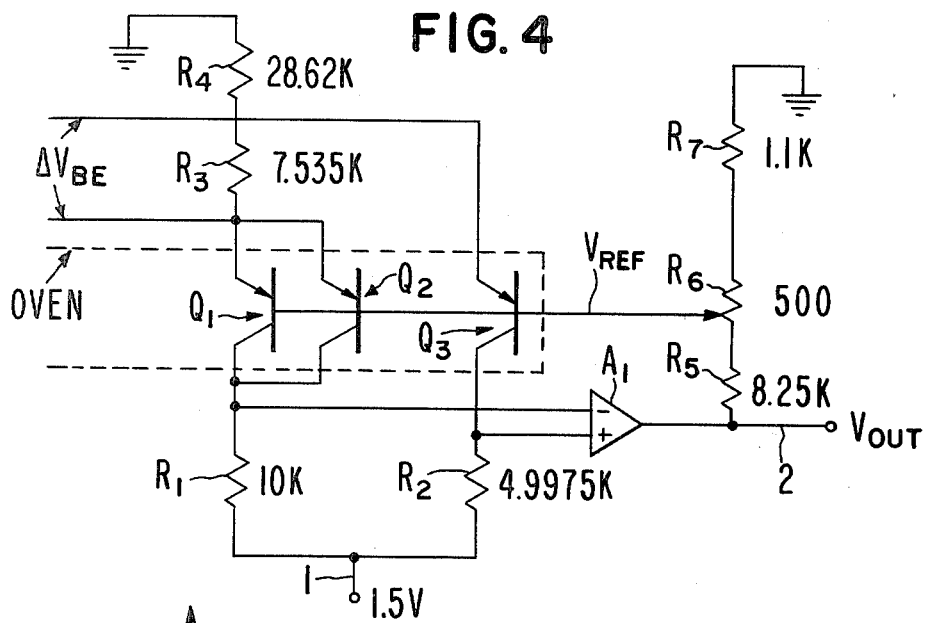
FIG. 4 shows the circuit containing lateral PNP transistors used in another embodiment of this invention.
Figure 5:
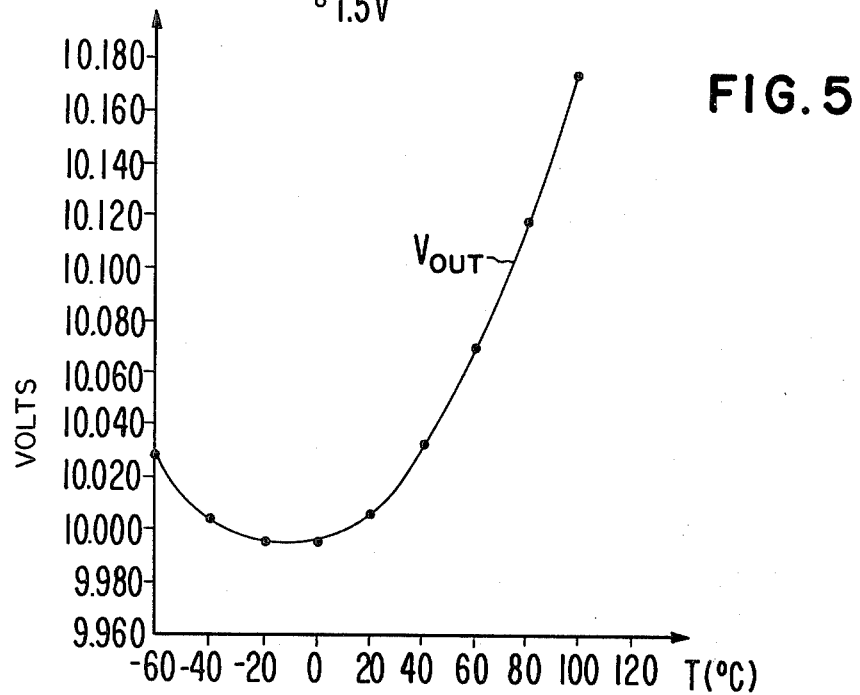
FIG. 5 shows the $V_{BE}$ vs. temperature relationship for the lateral PNP transistors used in the circuit of FIG. 4.

A Bandgap reference circuit which operates similarly to the circuit in FIG. 2 was also constructed using lateral PNP transistors contained in an oven of variable temperature ($Q_1$, $Q_2$, $Q_3$ in FIG. 4) with the $V_{BE}$ vs. temperature relationship shown in FIG. 5. These lateral PNP transistors had a base doping surface concentration of approximately $10^{15}$ atoms/cm$^3$, and a base sheet resistivity on the order of 2000 ohms/square.

Figure 1:
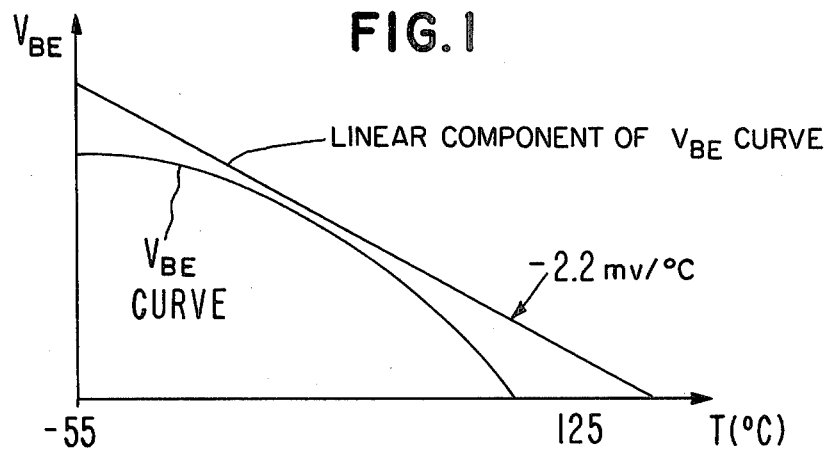
FIG. 1 shows a typical $V_{BE}$ vs. temperature relationship for an NPN transistor and its linear component of approximately $-2.2$ mv/°C.

Results for both the super Beta and lateral PNP circuits show curves which open upwards (FIGS. 3 and 5) as opposed to the $V_{BE}$ vs. temperature curves of typical NPN devices, which open downwards (FIG. 1).

As shown by the results in FIG. 3 and FIG. 5, by decreasing the doping concentration of the base, the nonlinearity of the $V_{BE}$ vs. temperature relationship can be changed from a curve which opens downwards (typical NPN) to a linear curve, to a curve which opens upwards ("super Beta" and lateral PNP transistors used in FIGS. 2 and 4).

Since a typical NPN transistor has a $V_{BE}$ vs. temperature curve which opens downwards, its base doping is too high (and base sheet resistivity is too low) to provide a linear $V_{BE}$ vs. temperature relation. Similarly, since super Beta NPN and lateral PNP transistors have a $V_{BE}$ vs. temperature curve which opens upwards, their base dopings are too low (and base sheet resistivities are too high) to provide a linear $V_{BE}$ vs. temperature relation.

In order to construct a transistor similar to the typical NPN transistor used in FIG. 2, and still obtain a linear $V_{BE}$ vs. temperature relationship, its base doping must be decreased from the typical NPN transistor base surface concentrations of approximately $10^{18}$ atoms/cm$^3$ and thus its base sheet resistivity raised. In order to construct transistors similar to the lateral PNP transistors used in FIG. 4, and still obtain a linear $V_{BE}$ vs. temperature relationship, their base doping must be increased from the base surface concentration of approximately $10^{15}$ atoms/cm$^3$ for lateral PNP transistors, and thus their base sheet resistivity lowered. In order to construct transistors similar to the super Beta transistors used in FIG. 4, their base doping must be increased from the base surface concentration of approximately $10^{16}$ atoms/cm$^3$, and thus their base sheet resistivities decreased.

Transistors were constructed in accordance with this invention by the same methods used to construct the typical "super Beta" transistors previously tested. However, their base dosage was increased from the $1 \times 10^{13}$ atoms/cm$^2$ normally used to $2.5 \times 10^{13}$ atoms/cm$^2$. The base dosage was raised by increasing the base predeposition time from that of the typical super Beta transistors. The base predeposition (which is the process of introducing a layer of impurity (Boron) at the wafer surface) was accomplished by using Boron Nitride as the source of impurity for approximately 25 minutes at 950°, in addition to a furance ramp-up of 12 minutes, and ramp-down of 30 minutes. The base diffusion consisted of a 15 minute furnace ramp-up, 35 minutes in wet O$_2$ at 1120° C., 115 minutes in dry O$_2$ at 1120° C., and a furnace ramp-down of 55 minutes. These operations provide a base depth of approximately 3.5–4.0 microns.

The base diffusion was followed by diffusing the emitter with Phosphorus to a depth of approximately 3.2–3.7 microns, providing the extremely narrow base width required for super Beta transistors. This was accomplished by a 5 minute ramp-up, 26 minutes predeposition using POCl$_3$ at 1000° C., and a 5 minute ramp-down. The diffusion cycle consisted of drive-in at 1100° C. for 20 minutes in wet O$_2$, followed by 20 minutes in dry O$_2$. Some additional diffusion occurs at the elevated temperatures used in the predeposition and diffusion cycles used to form the collector contact, although the super Beta emitter area is masked during this process. This consists of a 5 minute ramp-up, collector contact predeposition at 1000° C. for 20 minutes in wet O$_2$ and 20 minutes in dry O$_2$. This is followed by an oxidation step at 920° C. for 5 minutes in dry O$_2$, 50 minutes in wet O$_2$, and 5 minutes in dry O$_2$.

Figure 6:
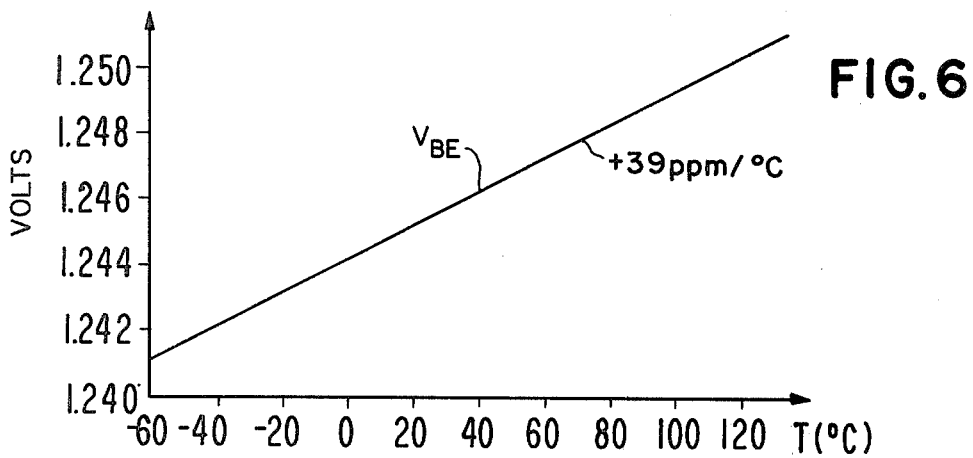
FIG. 6 shows the linear $V_{BE}$ vs. temperature relationship obtained from the circuit of FIG. 2 using transistors constructed in accordance with this invention.

These transistors were then inserted into the circuit of FIG. 2 and V$_{out}$ measured under varying temperature. The test results shown in FIG. 6 indicate that for a super Beta transistor fabricated in the same manner as the super Beta transistor used in earlier tests, the necessary base sheet dosage to construct a device with linear V$_{BE}$ vs. temperature characteristics is on the order of $2.5 \times 10^{13}$ atoms/cm$^2$. For other processes, this dosage will vary.

What I claim is:

1. A transistor comprising:
   a collector, an emitter, and a high resistivity base, the transistor having a base-emitter voltage V$_{BE}$ given by the equation $V_{BE} \approx V_{GO} + (kT/q) \ln (c/D)$, where V$_{GO}$ is the gap voltage of silicon at 0° K., k is Boltzman's constant, T is temperature of the base-eitter junction, q is the charge on an electron, I$_c$ is collector current and D is a temperature-independent constant, and wherein the doping concentration of said base is determined such that the second partial derivative of V$_{BE}$ with respect to temperature with I$_c$ held constant is approximately zero, thereby providing a linear relation between the base-emitter voltage and temperature.

2. A transistor comprising:
   a collector, an emitter, and a high resistivity base, the transistor having a base-emitter voltage V$_{BE}$ given by the equation $$V_{BE} \approx V_{GO} + (kT/q) \ln I_c / DT^\eta$$

where V$_{GO}$ is the gap voltage of silicon at 0° K., k is Boltzman's constant, T is temperature of the base-emitter junction, q is the charge on an electron, I$_c$ is the collector current, D is a temperature independent constant, and $\eta$ is an empirical parameter depending on doping concentration, said doping concentration of said base being formed such as to insure that the nonlinear base-emitter voltage-vs.-temperature relationship equals the nonlinear voltage-vs.-temperature relationships of other components.

3. Structure as in claim 2 with said base doping concentration being formed such as to insure that the nonlinear base-emitter voltage-vs.-temperature relationship is equal in magnitude and opposite in sign to the nonlinear voltage-vs.-temperature relationships of other components.

4. Structure as in claim 2, where said other components are diffused resistors.

5. Structure as in claim 2, where said other components are transistors.

6. An electrical circuit comprising:
   electrical components with nonlinear voltage-vs.-temperature characteristics, and transistors of claim 5, where said base doping concentration of said transistor is formed such as to insure that the nonlinear voltage-vs.-temperature characteristics of said electrical components and the nonlinear V$_{BE}$-vs.-temperature characteristics of said transistor exactly cancel,
   wherein the resulting voltage-vs.-temperature characteristics of said circuit as a whole is linear.

7. Structure as in claim 6 where said electrical components are diffused resistors.

8. Structure as in claim 6 where said electrical components are transistors.

9. Structure as in claim 3, where said other components are diffused resistors.

10. Structure as in claim 3, where said other components are transistors.

11. An electrical circuit comprising:
    electrical components with nonlinear voltage-vs.-temperature characteristics, and transistors of claim 6, where said base doping concentration of said transistor is formed such as to insure that the nonlinear voltage-vs.-temperature characteristics of said electrical components and the nonlinear V$_{BE}$-vs.-temperature characteristics of said transistor exactly cancel;
    wherein the resulting voltage-vs.-temperature characteristics of said circuit as a whole is linear.

12. Structure as in claim 11 where said electrical components are diffused resistors.

13. Structure as in claim 11 where said electrical components are transistors.

14. A method of constructing the transistor of claim 1 comprising:
    forming a buried layer collector region in a semiconductor wafer;
    predepositing a base impurity dosage of $2.5 \times 10^{13}$ atoms/cm$^2$ by applying boron nitride at a surface of the wafer for approximately 25 minutes at 950° C., in addition to a furnace ramp-up of 12 minutes and ramp-down of 30 minutes;
    diffusing base dopants applied by said predeposition by a 15-minute furnace ramp-up, 35 minutes in wet O$_2$ at 1120° C., 115 minutes in dry O$_2$ at 1120° C. and a furnace ramp-down of 55 minutes;

predepositing an emitter impurity by using a 5-minute furnace ramp-up, 26-minute wafer contact with POCl$_3$ at 1000° C., and 5-minute furance ramp-down;

diffusing the emitter impurity by placing said transistor for 20 minutes in wet O$_2$ at 1100° C. followed by 20 minutes in dry O$_2$ at 1100° C.;

predepositing a collector contact by subjecting the transistor in contact with the collector contact predeposition impurity to 5-minute furnace ramp-up, 20 minutes in wet O$_2$ at 1000° C., 20 minutes in dry O$_2$ at 1000° C.;

diffusing the collector contact impurity for 5 minutes in dry O$_2$ at 920° C., 50 minutes in wet O$_2$ at 1000° C., and 5 minutes in dry O$_2$ at 1000° C.

* * * * *